(12) United States Patent
Huang et al.

(10) Patent No.: US 10,060,683 B2
(45) Date of Patent: Aug. 28, 2018

(54) APPARATUS FOR POSITIONING HEAT SINK

(71) Applicants: Inventec (Pudong) Technology Corporation, Shanghai (CN); INVENTEC CORPORATION, Taipei (TW)

(72) Inventors: Yu-Chung Huang, Taipei (TW); Chen-Hui Chung, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 216 days.

(21) Appl. No.: 15/079,602

(22) Filed: Mar. 24, 2016

(65) Prior Publication Data

US 2017/0153069 A1    Jun. 1, 2017

(30) Foreign Application Priority Data

Nov. 26, 2015  (CN) .......................... 2015 1 0844891

(51) Int. Cl.
| | |
|---|---|
| *F28F 7/00* | (2006.01) |
| *H05K 7/20* | (2006.01) |
| *H05K 7/02* | (2006.01) |
| *H05K 7/04* | (2006.01) |
| *F28F 9/007* | (2006.01) |
| *F28D 21/00* | (2006.01) |
| *F28F 3/02* | (2006.01) |

(Continued)

(52) U.S. Cl.
CPC ............ *F28F 9/0075* (2013.01); *F28D 21/00* (2013.01); *F28F 3/02* (2013.01); *H05K 13/0015* (2013.01); *F28D 2021/0029* (2013.01); *F28F 2280/04* (2013.01); *H01L 23/40* (2013.01); *H01L 2023/4062* (2013.01); *H01L 2023/4087* (2013.01); *H05K 1/0203* (2013.01)

(58) Field of Classification Search
CPC ............... F28F 9/0075; F28F 2280/04; H01L 2023/4062; H01L 2023/4087; F28D 21/00; F28D 2021/0029; H05K 13/0015; H05K 13/0447; Y10T 29/53174; Y10T 29/53257
USPC ........................... 165/79, 80.2; 361/719, 807
See application file for complete search history.

(56) References Cited

U.S. PATENT DOCUMENTS

| | | | | |
|---|---|---|---|---|
| 5,329,426 A | * | 7/1994 | Villani | ................ H01L 23/4093 24/625 |
| 6,854,993 B1 | * | 2/2005 | McHugh | ................ H01R 12/88 439/196 |

(Continued)

*Primary Examiner* — Len Tran
*Assistant Examiner* — Paul Alvare
(74) *Attorney, Agent, or Firm* — Muncy, Geissler, Olds & Lowe, P.C.

(57) ABSTRACT

An apparatus for positioning a heat sink includes a base plate, two support assemblies and a mounting assembly. The base plate placed on a circuit board has an opening. The two support assemblies are disposed on two opposing sides of the opening respectively, and exposed partly to the opening for supporting a heat sink thereon. The mounting assembly includes a frame and a positioning member. The frame contacts the support assembly, and the positioning member is fixed on the frame. When the mounting assemblies move in a preset direction, the positioning member engages the heat sink, and the support assemblies would be retrieved from the opening, whereby the heat sink would be lowered to the heat sink setting area via the opening.

8 Claims, 9 Drawing Sheets

(51) Int. Cl.
*H05K 13/00* (2006.01)
*H01L 23/40* (2006.01)
*H05K 1/02* (2006.01)

(56) References Cited

U.S. PATENT DOCUMENTS

| | | | | |
|---|---|---|---|---|
| 7,492,598 | B2* | 2/2009 | Narasimhan | H01L 23/4006 361/719 |
| 7,872,870 | B2* | 1/2011 | Liu | H01L 23/4093 165/80.3 |
| 8,136,232 | B1* | 3/2012 | Yu | H05K 3/325 29/729 |
| 2004/0218365 | A1* | 11/2004 | Hashimoto | H01L 23/4093 361/719 |
| 2005/0083659 | A1* | 4/2005 | Gattuso | H01L 23/4093 361/704 |
| 2006/0156540 | A1* | 7/2006 | Cromwell | H05K 3/303 29/739 |
| 2007/0030652 | A1* | 2/2007 | Chen | H01L 23/4093 361/704 |
| 2007/0127214 | A1* | 6/2007 | Chen | H01L 23/4093 361/709 |

\* cited by examiner

APPARATUS FOR POSITIONING HEAT SINK

BACKGROUND OF INVENTION

1. Field of the Invention

The invention relates to an apparatus for positioning a heat sink, and more particularly to the apparatus for positioning a heat sink that implements a positioning member to assure a correct assembly of the heat sink to the circuit board.

2. Description of the Prior Art

Generally speaking, it is well known that heat generated during operations would downgrade computer performance to some degrees, even seriously enough to shutdown the computer. In the art, a combination of a heat sink and a fan is usually implemented to the computer for dissipating the heat inside the computer, mainly the heat generated by the main board. In order to enhance heat-dissipation efficiency, an airflow arrangement inside the computer housing is usually relevant to facilitate the heat dissipation for the computer. In particular, in the area that dies for efficient heat-dissipation, such as the CPU, an additional heat sink is usually implemented to increase the heat dissipation locally.

Figure 1:
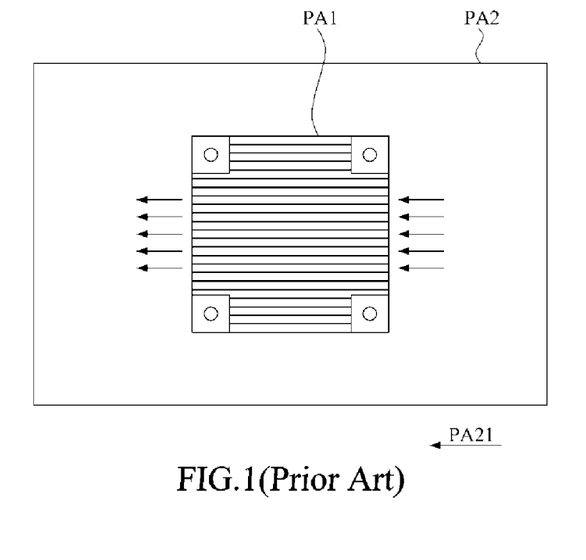
FIG. 1 demonstrates schematically a conventional heat sink having the parallel fins to be extended in a direction aligned with a direction of an airflow over a circuit board.
Figure 2:
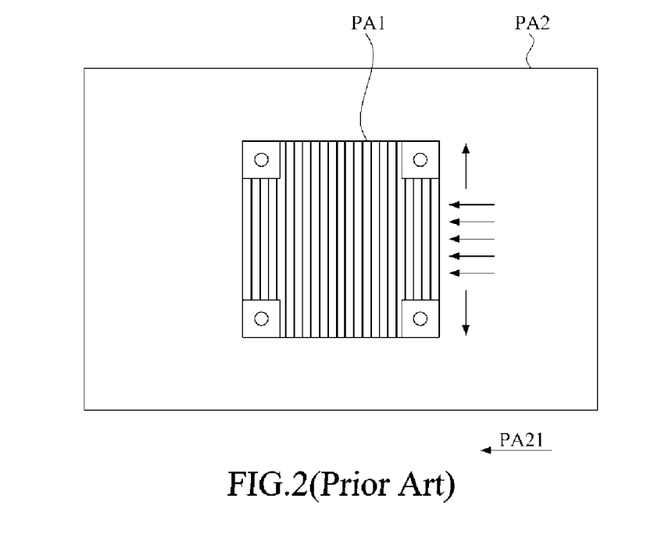
FIG. 2 demonstrates schematically the conventional heat sink of FIG. 1 having the parallel fins to be extended in a direction not aligned with the direction of the airflow over the circuit board.

Refer to FIG. 1 and FIG. 2, which FIG. 1 is a schematic view of a conventional heat sink having parallel fins extending in the airflow direction, and FIG. 2 is a schematic view of the conventional heat sink of FIG. 1 having the parallel fins perpendicular to the airflow direction. As shown, when the heat sink PA1 is arranged to have the parallel fins align with the airflow direction PA21 over the circuit board PA2, the heat of the heat sink PA1 would be efficiently dissipated to the airflow. On the other hand, when the heat sink PA1 is arranged not to have the parallel fins align with the airflow direction PA21 over the circuit board PA2, the efficiency of the heat of the heat sink PA1 to be dissipated to the airflow would be low.

SUMMARY OF THE INVENTION

As described in the background section, it is known that the extending direction of the parallel fins of the heat sink with respect to the airflow would be highly correlated to the heat-dissipation efficiency of the heat sink. In particular, if a parallel pattern is established between the extending direction of the parallel fins of the heat sink and the airflow, the heat-dissipation efficiency of the heat sink would be high.

Accordingly, it is the primary object of the present invention to provide an apparatus for positioning a heat sink that implements a positioning member to ensure the extending direction of the parallel fins of the heat sink to be aligned in a preset heat-dissipating direction.

In the present invention, the apparatus for positioning a heat sink is applicable to place a heat sink onto a circuit board, in which the heat sink has a plurality of parallel heat-dissipating fins extended in a specific direction and the circuit board has a heat sink setting area and a preset heat-dissipating direction. The apparatus for positioning the heat sink comprises a base plate, two support assemblies and a mounting assembly. The base plate to be placed on the circuit board has an opening located at a place correspondingly to the heat sink setting area. The two support assemblies located to two opposing sides of the opening by exposing partly to the opening are used together to hold the heat sink on the opening. The mounting assembly located on the base plate and being movable in the preset heat-dissipating direction further includes a frame and a position member. The frame contacts the two support assemblies in an interference manner. The positioning member fixedly located on the frame is to engage the heat-dissipating fins.

In the present invention, when the mounting assembly moves in the preset heat-dissipating direction to have the positioning member to engage the heat-dissipating fins, the two support assemblies are moved by the frame and thus to retrieve back from the opening, such that the heat sink is able to be lowered to the heat sink setting area via the opening with the specific direction parallel to the preset heat-dissipating direction.

In one embodiment of the present invention, each of the two support assemblies further includes a supportive plate and a supportive pillar. The supportive plate is movably mounted on the base plate in a lateral direction perpendicular to the preset heat-dissipating direction and is exposed partly to the opening for holding the heat sink on the opening. The supportive pillar fixedly located on the supportive plate is movable in the lateral direction over and with respect to the base plate.

Preferably, the base plate further has two constraint slots located on the two opposing side of the opening and extended in the lateral direction, the two supportive pillars being accommodated respectively by the two constraint slots.

Preferably, the frame further includes a frame body and two lateral frames. The two lateral frames are extended in the preset heat-dissipating direction, and each of the two lateral frames further has a guide groove formed as a sliding pair with a corresponding one of the two supportive pillars. The guide groove has a driving slope. When the mounting assembly moves in the preset heat-dissipating direction so as to have the positioning pins engage the heat-dissipating fins, the two lateral frames retrieve the two support assemblies back from the opening by the driving provided by the corresponding driving slope.

In addition, the guide groove has a driving slope, wherein, as the mounting assembly moves in the preset heat-dissipating direction so as to have the positioning pins engage the heat-dissipating fins, the two lateral frames retrieve the two support assemblies back from the opening by driving of the corresponding driving slope.

In one embodiment of the present invention, the mounting assembly further includes a pushrod, a stop collar and a control rod, the pushrod connecting to the frame, the stop collar anchoring the pushrod on the base plate and restraining the pushrod to be displaceable in the preset heat-dissipating direction, the control rod being moved and connected with the pushrod so as to drive the pushrod to move in the preset heat-dissipating direction.

In one embodiment of the present invention, the positioning member has at least one positioning pin extended in the preset heat-dissipating direction. Preferably, the positioning member has a plurality of positioning pins individually extended in the preset heat-dissipating direction, and each of the positioning pins has a front end further having a chamfer.

By providing the apparatus for positioning the heat sink in this present invention, the positioning member is introduced to ensure that the heat sink can be correctly anchored on the circuit board in the same preset heat-dissipating direction, so that misalignment of the heat sink on the circuit board can be completely avoided. Thereupon, the heat dissipation efficiency of the heat sink can be assured, and no repeating labor is needed for remounting the heat sink.

All these objects are achieved by the apparatus for positioning a heat sink described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an apparatus for positioning a heat sink. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 3:
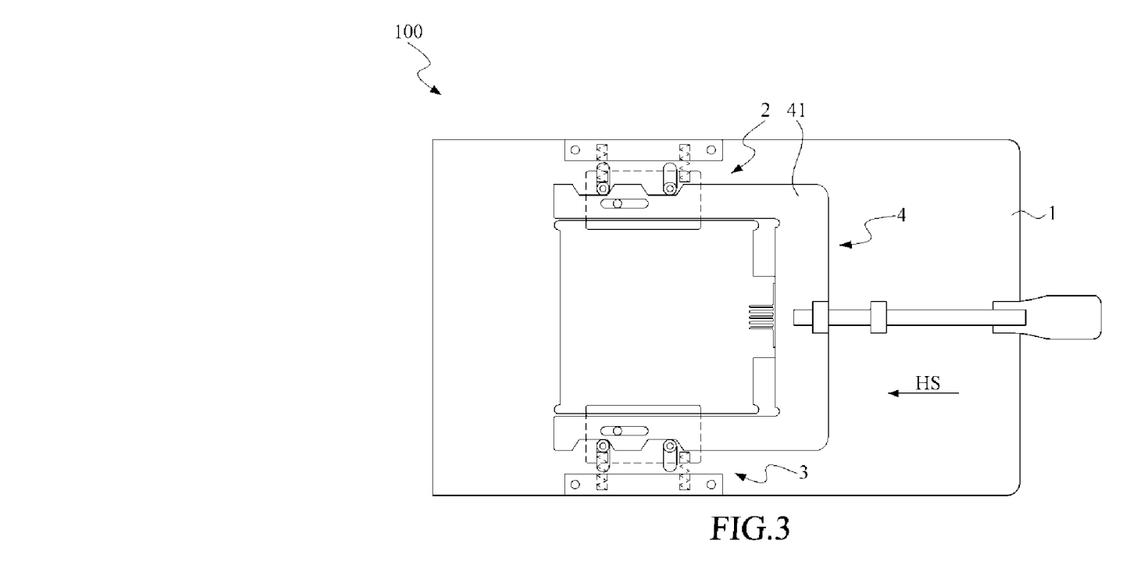
FIG. 3 is a schematic planar view of a preferred embodiment of the apparatus for positioning a heat sink in accordance with the present invention.
Figure 4:
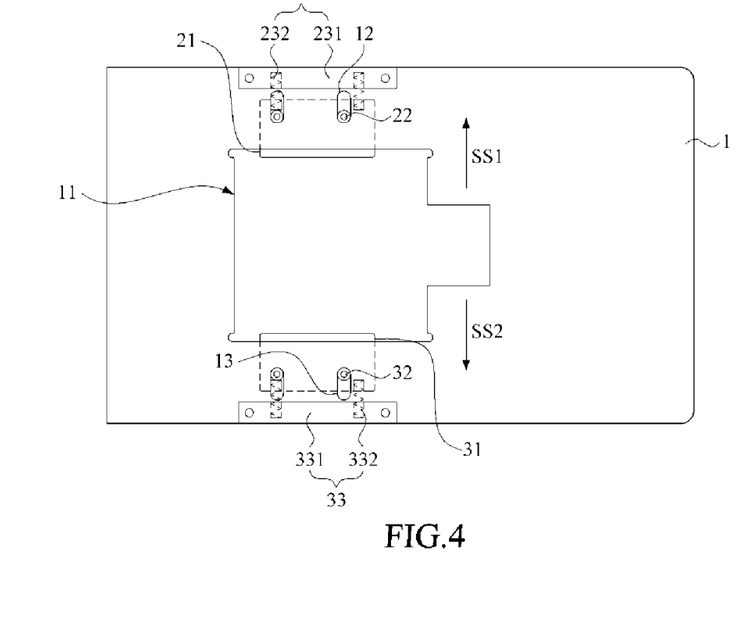
FIG. 4 is another view of FIG. 3 by removing the mounting assembly.
Figure 5:
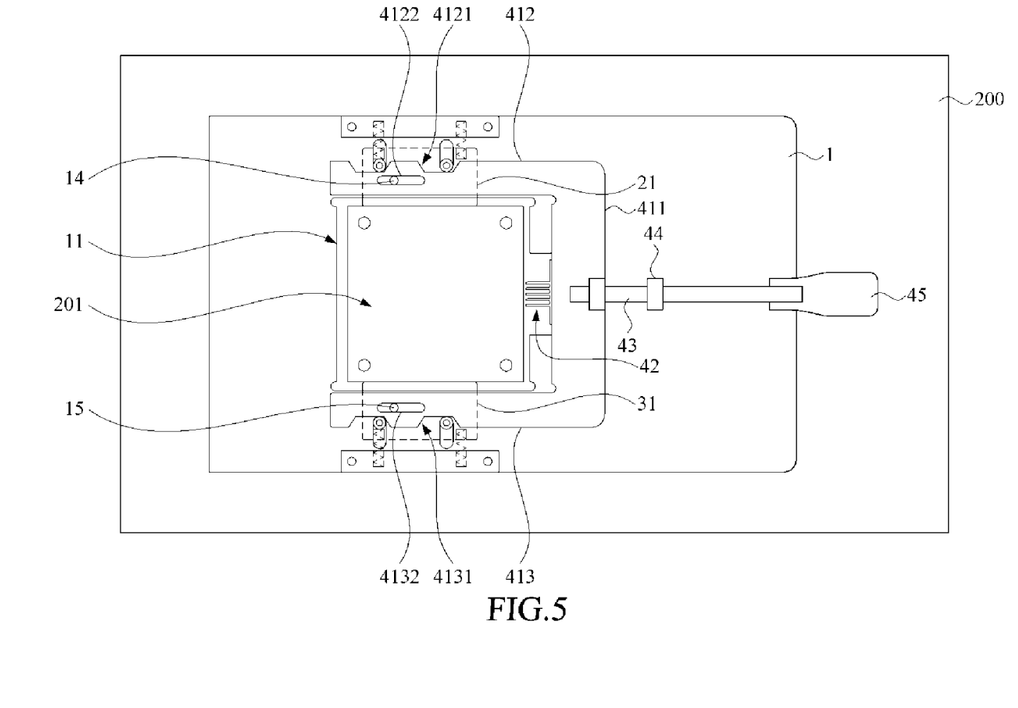
FIG. 5 demonstrates the apparatus for positioning a heat sink of FIG. 3 disposed on a circuit board.

Refer now to FIG. 3, FIG. 4 and FIG. 5; in which FIG. 3 is a schematic planar view of a preferred embodiment of the apparatus for positioning a heat sink in accordance with the present invention, FIG. 4 is another view of FIG. 3 by removing the mounting assembly, and FIG. 5 demonstrates the apparatus for positioning a heat sink of FIG. 3 disposed on a circuit board. The apparatus for positioning a heat sink 100 includes a base plate 1, two support assemblies 2, 3 and a mounting assembly 4.

The base plate 1 has an opening 11, two constraint slots 12 (one labeled in the figure), another two constraint slot 13 (one labeled in the figure) opposing to the constraint slots 12, a constraint pillar 14 and another constraint pillar 15 opposing to the constraint pillar 14. The constraint slots 12 and 13 are disposed at two opposing sides of the opening 11, and extend along a lateral direction SS1 and a lateral direction SS2, respectively. The lateral direction SS1 and the lateral direction SS2 are pointing to opposite directions. The two constraint pillars 14 and 15 are also located to the two opposing sides of the opening 11.

The support assemblies 2 and 3 are respectively mounted to the two opposing sides of the opening 11, and each of the support assemblies 2 and 3 further includes a supportive plate 21, two supportive pillars 22 (one labeled in the figure) and two elastic supportive members 23 (one labeled in the figure).

The supportive plate 21 is located aside to the base plate 1 in a manner of being movable in the lateral direction SS1 and exposed partly to the opening 11. The supportive pillar 22 fixed at the supportive plate 21 and located in the constraint slot 12 is movable along the constraint slot 12 of the base plate 1, so that the movement of the supportive pillar 22 can be limited inside the constraint slot 12 and in the lateral direction SS1. The elastic supportive member 23 includes an elastic supportive block 231 and two elastic members 232 (one labeled in the figure). The elastic supportive block 231 is located at one side of the opening 1 and at a place out of the supportive plate 21. The elastic member 232 located between the elastic supportive block 231 and the supportive plate 21 is to contact elastically with the supportive plate 21 so as able to drive the supportive plate 21 to move toward the opening 11 in a direction opposing to the lateral direction SS1.

The supportive plate 31 is located to another side of the base plate 1 in a manner of being movable in the lateral direction SS2 and exposed partly to the opening 11. The supportive pillar 32 fixed at the supportive plate 31 and located in the constraint slot 13 is movable along the constraint slot 13 of the base plate 1, so that the movement of the supportive pillar 32 can be limited inside the constraint slot 13 and in the lateral direction SS2. The elastic supportive member 33 includes an elastic supportive block 331 and two elastic members 332 (one labeled in the figure). The elastic supportive block 331 is located at one side of the opening 1 and at a place out of the supportive plate 31. The elastic member 332 located between the elastic supportive block 331 and the supportive plate 31 is to contact elastically with the supportive plate 31 so as able to drive the supportive plate 31 to move toward the opening 11 in a direction opposing to the lateral direction SS2. The two supportive plates 21 and 31 are symmetrically located to opposing sides of the opening 11.

The mounting assembly 4 mounted along a preset heat-dissipating direction HS perpendicular to both the lateral directions SS1, SS2 can move back and forth with respect to the base plate 1, and further includes a frame 41, a positioning member 42, a pushrod 43, a stop collar 44 and a control rod 45. The frame 41 includes a frame body 411 and two lateral frames 412, 413. The two lateral frames 412, 413 are extended in the preset heat-dissipating direction HS, and each of the two lateral frames 412, 413 has two guide grooves 4121 or 4131 (one labeled for each lateral frame in the figure) and a guide slot 4122 or 4132. The guide groove 4121 has a driving slope 41211, and similarly the guide groove 4131 has another driving slope 41311, in which the driving slopes 41211 and 41311 are cooperated to contact the supportive pillars 22 and 32 in an interference manner. The guide slots 4122 and 4132 both extended in the preset heat-dissipating direction HS is to accommodate the constraint pillars 14 and 15, respectively, such that the two lateral frames 412 and 413 can move in the preset heat-dissipating direction HS in a restrained manner.

The positioning member 42 fixedly located at the frame body 411 includes a plurality of parallel positioning pins 421 extended in the preset heat-dissipating direction HS. Each of the positioning pins 421 has a front end further having a chamfer 4211. The pushrod 43 is fixed to the frame body 411. The stop collar 44 is to anchor the pushrod 43 on the base plate 1. The pushrod 43 is movable in the preset heat-dissipating direction HS. The control rod 45 is connected to the pushrod 43 in a co-movement manner so as to drive the pushrod 43 to move in the preset heat-dissipating direction HS.

Figure 6:
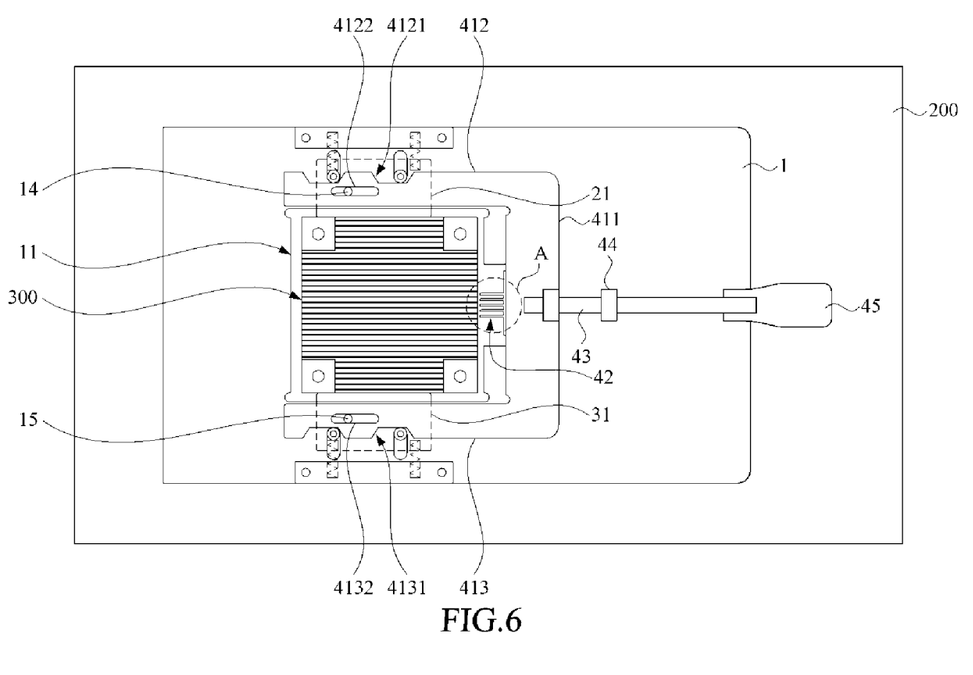
FIG. 6 is another schematic view of FIG. 5 with a top-on heat sink.
Figure 6A:
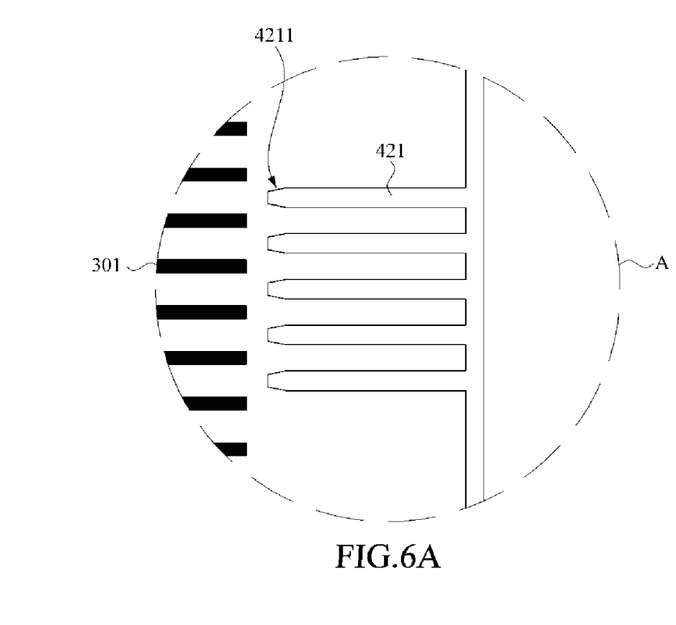
FIG. 6A is an enlarged view of area A of FIG. 6.
Figure 7:
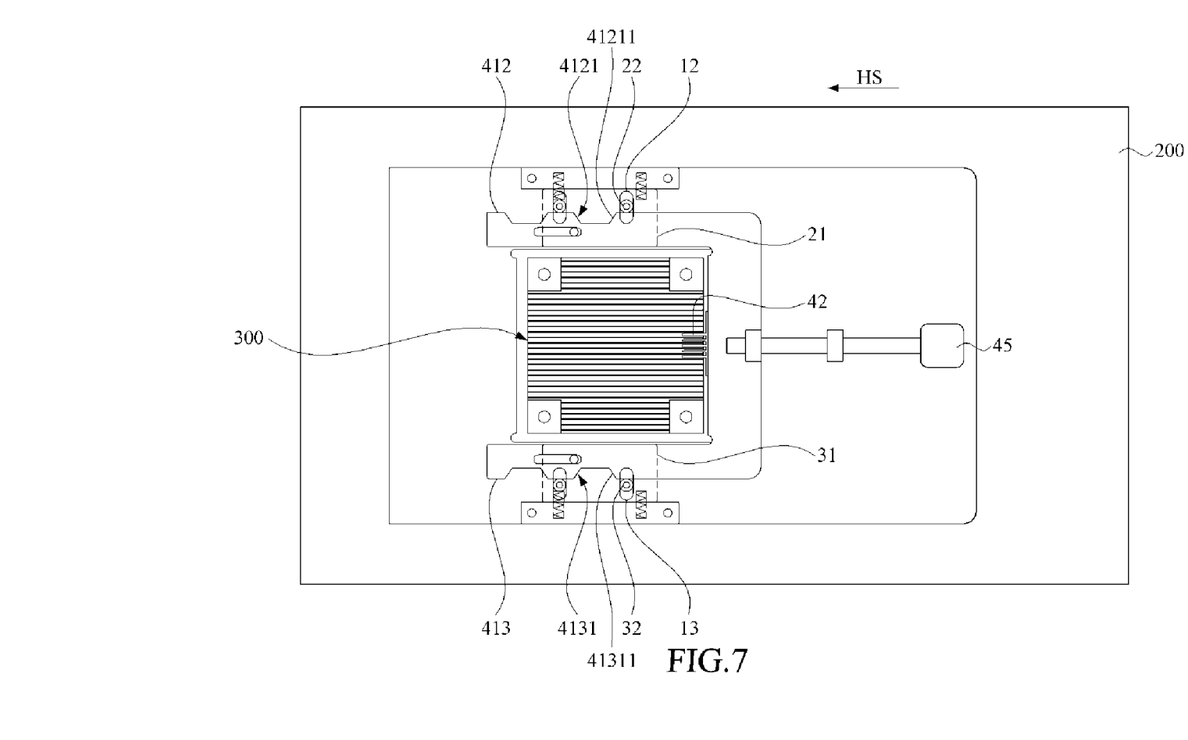
FIG. 7 is a further view of FIG. 6 with the heat sink positioned down to the circuit board by applying the apparatus for positioning the heat sink in accordance with the present invention.

Refer now to FIG. 6, FIG. 6A and FIG. 7; in which FIG. 6 is another schematic view of FIG. 5 with a top-on heat sink, FIG. 6A is an enlarged view of area A of FIG. 6, and FIG. 7 is a further view of FIG. 6 with the heat sink positioned down to the circuit board by applying the apparatus for positioning the heat sink in accordance with the present invention.

As shown, in practice, the apparatus for positioning the heat sink 100 is firstly to be placed on a circuit board 200, where the circuit board 200 has a heat sink setting area 201 and the preset heat-dissipating direction HS. While the apparatus for positioning the heat sink 100 is placed onto the circuit board 200, since the supportive plates 21 and 31 would be pushed by the elastic supportive members 23 and 33 so as to be exposed in the opening 11, thus a heat sink 300 to be mounted into the heat sink setting area 201 via the opening 11 would be firstly stopped or held by the supportive plates 21 and 31. It is noted that the heat sink 300 includes a plurality of parallel heat-dissipating fins 301 extended in a specific direction (in FIG. 7, the specific direction is the preset heat-dissipating direction HS). Then, as a user bends the control rod 45 to move the pushrod 43 in the preset heat-dissipating direction HS, the positioning pins of the positioning member 42 would go forward to engage the heat-dissipating fins of the heat sink 300. At the same time, since the two lateral frames 412 and 413 move in the preset heat-dissipating direction HS so as to move the guide grooves 4121 and 4131 to move in the preset heat-dissipating direction HS as well, thus the supportive pillars 22 and 32 would be pushed by the driving slopes 41211 and 41311. Further, since the supportive pillars 22 and 32 are individually restrained by the constraint slots 12 and 13, thus the supportive pillars 22 and 32 would move in the lateral directions SS1 and SS2, respectively, so that the supportive plates 21 and 31 would retrieve back from the opening 11 in the lateral direction SS1 and SS2, respectively. Upon such an arrangement, the heat sink 300 would be lowered down to the heat sink setting area 201 via the opening 11, and then the user can lock the heat sink onto the circuit board 200 in a state that the heat-dissipation fins of the heat sink 300 are extended parallel in the preset heat-dissipating direction HS. In addition, since each of the positioning pins 42 has a front chamfer 4211, thus the positioning pins 42 can engage the corresponding the heat-dissipating fins 301 smoothly.

Figure 8:
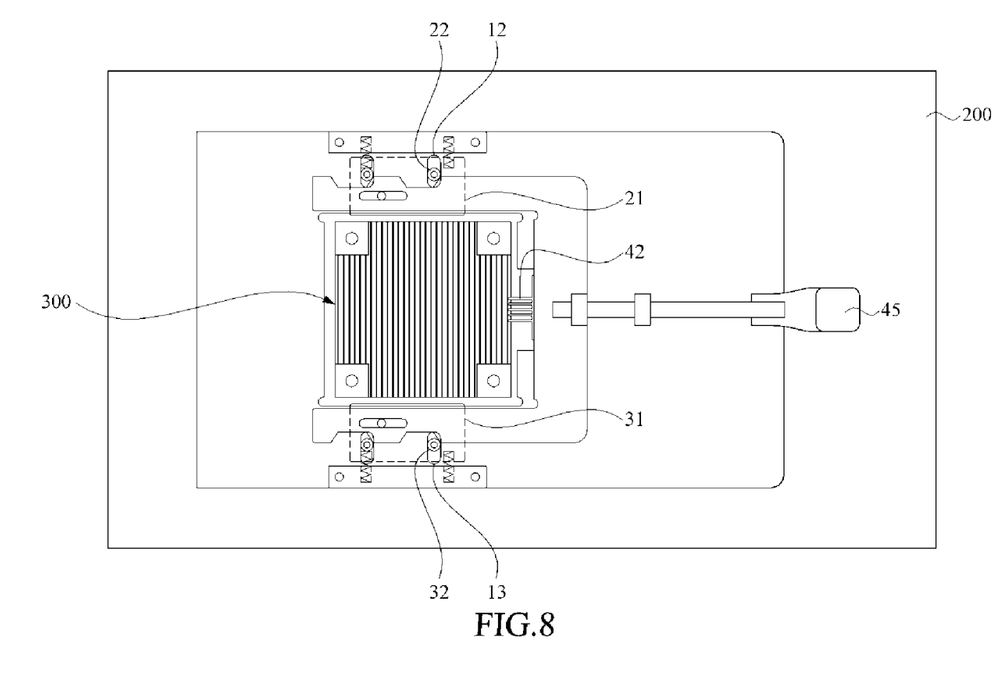
FIG. 8 demonstrates a misalignment of the heat sink, in which the heat sink can't be located in position onto the circuit board.

Referring now to FIG. 8, a misalignment of the heat sink is shown, from which the heat sink can't be located in position onto the circuit board. In the case that the user places the heat sink 300 on the supportive plates 21 and 31 with the heat-dissipation fins of the heat sink 300 extended perpendicular to the preset heat-dissipating direction HS, then the positioning pins of the positioning member 42 would be unable to engage the corresponding heat-dissipating fins 301 of the heat sink 300 even that the control rod 45 is bent hard. In this circumstance, the guide grooves 4121 and 4131 can only slightly move the supportive pillars 22 and 32 in the corresponding lateral directions SS1 and SS2, such that the heat sink 300 won't be lowered to the circuit board.

As described above, by providing the apparatus for positioning the heat sink in this present invention, the positioning member is introduced to ensure that the heat sink can be correctly anchored on the circuit board in the same preset heat-dissipating direction, so that misalignment of the heat sink on the circuit board can be completely avoided. Thereupon, the heat dissipation efficiency of the heat sink can be assured, and no repeating labor is needed for remounting the heat sink.

While the present invention has been particularly shown and described with reference to a preferred embodiment, it will be understood by those skilled in the art that various changes in form and detail may be without departing from the spirit and scope of the present invention.

What is claimed is:

1. An apparatus for positioning a heat sink, applicable to place the heat sink onto a circuit board, the heat sink having a plurality of parallel heat-dissipating fins extended in a specific direction, the circuit board having a heat sink setting area and a preset heat-dissipating direction, comprising:
   a base plate, to be placed on the circuit board, having an opening located correspondingly to the heat sink setting area;
   two support assemblies, located on two opposing sides of the opening and being partly exposed relative to the opening, the two support assemblies holding the heat sink placed on the opening; and
   a mounting assembly, located on the base plate and being movable in the preset heat-dissipating direction, further comprising:
      a frame, contacting the two support assemblies in an interference manner; and
      a positioning member, fixedly located on the frame, to be engaged with the heat-dissipating fins;
   wherein, when the mounting assembly moves in the preset heat-dissipating direction to have the positioning member engage the heat-dissipating fins, the two support assemblies are moved by the frame in a direction away from the opening, such that the heat sink is able to be lowered to the heat sink setting area via the opening with the specific direction parallel to the preset heat-dissipating direction;
   wherein each of the two support assemblies further includes:
      a supportive plate, movably mounted on the base plate in a lateral direction perpendicular to the preset heat-dissipating direction, being partly exposed to the opening for holding the heat sink on the opening; and
      a supportive pillar, fixedly located on the supportive plate and movable in the lateral direction over and with respect to the base plate.

2. The apparatus for positioning the heat sink of claim 1, wherein the base plate further has two constraint slots located on the two opposing side of the opening and extending in the lateral direction, the two supportive pillars being accommodated respectively by the two constraint slots.

3. The apparatus for positioning the heat sink of claim 1, wherein the frame further includes:
   a frame body; and
   two lateral frames, extending in the preset heat-dissipating direction, each of the two lateral frames further having a guide groove that contacts the corresponding one of the two supportive pillars when the mounting assembly moves in the preset heat dissipating direction.

4. The apparatus for positioning the heat sink of claim 3, wherein the guide groove has a driving slope, wherein, as the mounting assembly moves in the preset heat-dissipating direction so as to have the positioning member engage the heat-dissipating fins, the displacement of the two lateral frames allows the two support assemblies to travel away from the opening as the support pillar moves along the driving slope.

5. The apparatus for positioning the heat sink of claim 1, wherein each of the two support assemblies includes an elastic supportive member located at the corresponding side of the opening for pushing the supportive plate toward the opening.

6. The apparatus for positioning the heat sink of claim 1, wherein the mounting assembly further includes a pushrod, a stop collar and a control rod, the pushrod connected to the frame, the stop collar anchoring the pushrod on the base plate and restraining the pushrod to be displaceable in the preset heat-dissipating direction, the control rod being moved and connected with the pushrod so as to drive the pushrod to move in the preset heat-dissipating direction.

7. The apparatus for positioning the heat sink of claim 1, wherein the positioning member has at least one positioning pin extending in the preset heat-dissipating direction.

8. The apparatus for positioning the heat sink of claim 1, wherein the positioning member has a plurality of positioning pins individually extending in the preset heat-dissipating direction.

\* \* \* \* \*